United States Patent
Nidan et al.

(10) Patent No.: US 6,591,689 B2
(45) Date of Patent: Jul. 15, 2003

(54) SENSOR HELD BY BASE HAVING LEAD

(75) Inventors: Akira Nidan, Okazaki (JP); Takafumi Taki, Nagoya (JP); Hideaki Hara, Chiryu (JP); Michihiro Masuda, Anjo (JP); Kaname Ban, Obu (JP); Kazuo Tanaka, Obu (JP); Yoshifumi Murakami, Tokai (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/894,907

(22) Filed: Jun. 29, 2001

(65) Prior Publication Data

US 2002/0005072 A1 Jan. 17, 2002

(30) Foreign Application Priority Data

Jun. 30, 2000 (JP) .......................................... 2000-199443
Jan. 18, 2001 (JP) .......................................... 2001-010682

(51) Int. Cl.$^7$ ................................................. G01L 9/16
(52) U.S. Cl. ................................. 73/754; 73/715; 73/73; 73/756
(58) Field of Search ........................... 73/715, 723, 749, 73/753, 754, 733, 706; 257/415, 417; 438/112

(56) References Cited

U.S. PATENT DOCUMENTS

| | | | | | |
|---|---|---|---|---|---|
| 4,881,056 | A | * | 11/1989 | Mizukoshi et al. | ............ 338/4 |
| 5,164,328 | A | | 11/1992 | Dunn et al. | |
| 5,200,363 | A | | 4/1993 | Schmidt | |
| 6,114,191 | A | * | 9/2000 | Young et al. | ................ 257/621 |
| 6,140,144 | A | * | 10/2000 | Najafi et al. | ................. 438/106 |
| 6,159,770 | A | * | 12/2000 | Tetaka et al. | ................ 438/112 |
| 6,369,435 | B1 | * | 4/2002 | Igel | ............................. 257/415 |

OTHER PUBLICATIONS

U.S. patent application Ser. No. 09/131,169, Yoshihara et al., filed Aug. 7, 1998.

* cited by examiner

*Primary Examiner*—Max Noori
*Assistant Examiner*—Andre Allen
(74) *Attorney, Agent, or Firm*—Posz & Bethards, PLC

(57) ABSTRACT

A pressure sensor has a sensor chip with a diaphragm formed therein and bumps formed thereon, and a stem with leads extending from a surface thereof to the sensor chip. The bumps and the leads are electrically connected by face down bonding so that a surface of the sensor chip faces the surface of the stem. In this manner, bonding wires are unnecessary. Therefore, an area for disposing the bonding wires in the stem can be cut down, so that the pressure sensor can be miniaturized.

58 Claims, 9 Drawing Sheets

| STEM MATERIAL | DIFFERENCE | INFLUENCE ON OUTPUT |
|---|---|---|
| IRON | 12ppm/°C | × |
| 50 ALLOY | 6ppm/°C | ○ |
| COVAR, 42 ALLOY, 36 ALLOY | 1.5ppm/°C | ◎ |

SENSOR HELD BY BASE HAVING LEAD

CROSS REFERENCE TO RELATED APPLICATIONS

This application is based upon Japanese Patent Application Nos. 2000-199443 filed on Jun. 30, 2000, and 2001-10682 filed on Jan. 18, 2001, the contents of which are incorporated herein by reference.

BACKGROUND OF THE INVENTION

1. Field of the Invention

This invention relates to a sensor, and more particularly, to a structure of a pressure sensor assembly having a base with a lead and a sensor chip connected to the base through the lead so that the sensor chip is held by the base.

2. Description of the Related Art

A pressure sensor held by a base having external leads is disclosed in JP-A-7-209115, or in JP-A-7-243926, and is shown in FIG. 15 as a prior art.

The pressure sensor has a sensor chip 44 with one side on which a diaphragm 55 is formed as a sensing portion. The sensor chip 44 is fixed to a pedestal 66, and is mounted on a stem 111 as a base plate having leads 22. The sensor chip 44 is electrically connected to the leads 22 through wirings J1.

Recently, the pressure sensor is, however, required to be miniaturized. In case of the pressure sensor shown in FIG. 15, the stem 111 must have a predetermined area above which the wirings J1 are disposed as well as an area for mounting the sensor chip 44, so that a miniaturization of the sensor must depend on a miniaturization of the sensor chip 44.

SUMMARY OF THE INVENTION

This invention has been conceived in view of the background as described above and an object of the invention is to provide a pressure sensor held by a base with a lead, capable of miniaturizing a size thereof.

According to a first aspect of the present invention, a sensor chip is electrically fixed to leads through electrodes formed on a surface thereof so that a surface of the sensor chip faces a surface of a base directly. As a result, a predetermined area of a base for disposing a wiring thereon can be cut down.

Preferably, the sensor chip is fixed to the base by a face down bonding.

Preferably, the leads are disposed within an area corresponding to the sensor chip when the sensor chip is fixed to the leads.

Preferably, a difference in a liner expansion coefficient between the base and the sensor chip is 10 ppm/° C. or less. More preferably, the difference is 6 ppm/° C. or less. Furthermore preferably, the difference is 2 ppm/° C. or less. As a result, influence to the sensor chip caused by the difference in the liner expansion coefficient between the base and the sensor chip is restrained. In other words, an output from the sensor chip is prevented from varying by the difference.

Preferably, the electrodes disposed on the sensor chip are ball-shaped bumps formed by a wire bonding method. The ball-shaped bumps can absorb variation in height of the leads by deforming themselves. Moreover, the ball-shaped bumps can absorb shock occurring in connecting the bumps to the leads.

Preferably, the electrodes are formed by a metal plating method. By this method, electrodes can be formed before the sensor chip is diced from a wafer, and can be changed in size easily.

Preferably, the ball-shaped bumps are formed on the metal electrodes.

Preferably, the electrodes are connected to the leads through an intermediate. The intermediate can absorb variation in height of the leads. The intermediate is, for example, conductive paste, conductive resin film or the like.

Preferably, a region of the sensor chip including portion where the electrodes are formed is covered with a protection member. In this case, Yong's modulus is preferably 1 GPa or less to decrease stress applied to the sensor chip, which is caused by the protection member, so that the output of the sensor chip is not varied by the stress of the protection member so much. More preferably, the protection is gelatinized resin (gel) because it is soft.

Preferably, the protection member is a membrane, so that the output of the sensor chip is not varied by the membrane so much since it is thin.

Preferably, the protection member coats sides of the sensor chip, which are exposed by dicing the sensor chip from the wafer.

Preferably, the electrodes are arranged so that the electrodes do not surround a diaphragm formed in the sensor chip, so that stress caused by the base is prevented from transmitting to the diaphragm.

Preferably, a stress relaxation member is disposed between one of the electrodes and one of the leads.

For example, the stress relaxation member is a lead capable of elastic deformation. The lead has a weak portion, or an hourglass portion.

The sensor chip may be fixed to the leads through the electrodes formed on the surface thereof so that an extending direction of the leads is in parallel with the surface of the sensor chip.

Other objects, features and advantages of the present invention will become more apparent from the following detailed description made with reference to the accompanying drawings.

DESCRIPTION OF THE EMBODIMENTS

Figure 1:
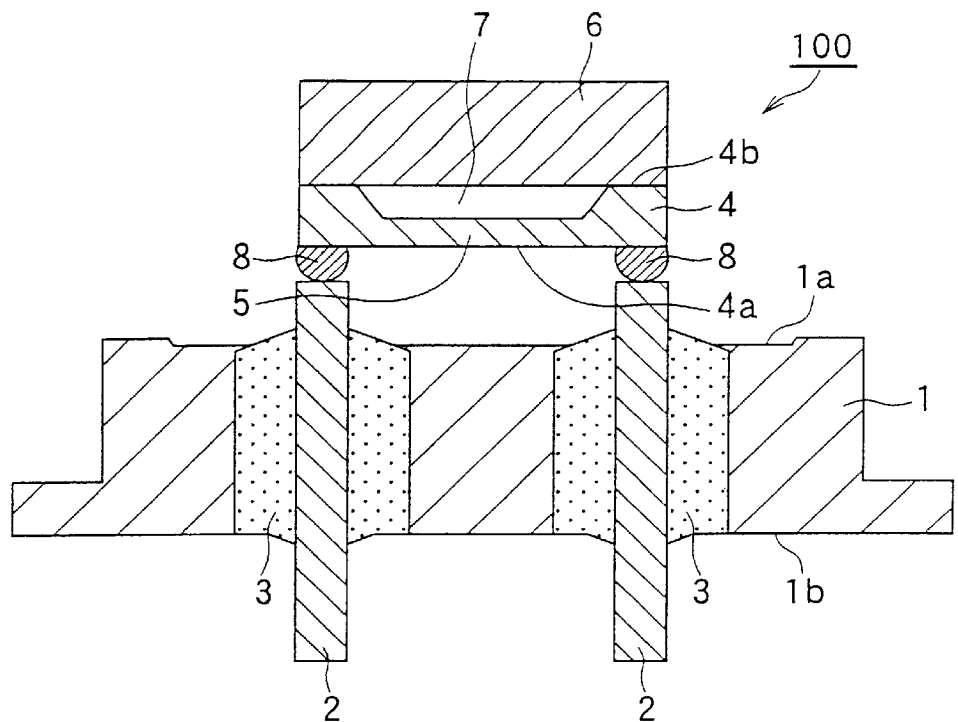
FIG. 1 is a schematic cross sectional view of a pressure sensor (first embodiment)

Specific embodiments of the present invention will now be described hereinafter with reference to the accompanying drawings in which the same or similar component parts are designated by the same or similar reference numerals.

(First Embodiment)

Referring to FIG. 1, a pressure sensor 100 has a sensor chip 4 and a metallic stem (base) 1 holding the sensor chip 4 through leads 2.

The leads 2 penetrate the metallic stem 1 so that both ends of each of the leads 2 protrude from main and back surfaces 1a and 1b of the stem 1. The leads 2 are disposed away from the metallic stem 1 with gaps interposed therebetween. The gaps provided between the leads 2 and the metallic stem 1 are filled with hermetic seal glasses 3 so that the leads 2 are fixed to, and held by the metallic stem 1. As a result, the leads 2 are insulated from the metallic stem 1. The leads 2 connect wiht an external circuit (not shown) at the back surface 1b, so that the leads 2 transmit signals between the sensor chip 4 and the external circuit. The stem 1 and leads 2 are made of the same material as each other. Copper or steel (covar, 42 alloy, 36 alloy or the like) is used for the stem 1 and leads 2, for example. Incidentally, the number of the leads 2 is four so that the leads 2 surround a diaphragm 5 of the sensor chip 4. First one of them supplies power to the sensor chip 4, second one of them supplies ground to the sensor chip 4, third one of them transmits an output from the sensor chip 4, and remaining one is an adjusting terminal.

The sensor chip 4 is made of semiconductor material (silicon or the like). The sensor chip 4 has the diaphragm 5 formed at a main surface 4a thereof. The diaphragm 5 is thinned by etching so as to be deformed by pressure applied thereto in a thickness direction thereof. The diaphragm 5 constitutes a sensing portion in which piezo-resistors are formed. The piezo-resistors change in resistance when the piezo-resistors deform in accordance with deformation of the diaphragm 5 by pressure applied thereto. The sensor chip 4 detects the pressure applied thereto by generating an electric signal at the piezo-resistors in proportion with the pressure at the sensing portion. The electric signal is outputted to one of the leads 2 through a signal processing circuit (not shown) formed in the sensor chip 4. The signal processing circuit adjusts and amplifies the electric signal. The sensor chip 4 is formed through a well-known wafer manufacturing process.

The sensor chip 4 is attached to a pedestal 6 made of Si, glass or the like at a back surface 4b of the sensor chip 4 by anodic bonding so that a reference pressure chamber 7 is formed between a back surface of the diaphragm 5 (back surface 4b) and the pedestal 6. The reference pressure chamber is in vacuum, for example.

The sensor chip 4 has electrode pads (not shown) made of aluminum or the like, which are formed on the main surface 4a. Bumps 8 (ball-shaped in this embodiment) are formed on the electrode pads. The bumps 8 are made of a conductive metal (gold or the like), and electrically connected to the leads 2 by thermocompression bonding, ultrasonic-compression bonding, or pressure bonding (contact bonding, solderless contact) using both heat and ultrasonic wave, so that the main surface 1a of the stem 1 faces the main surface 4a of the sensor chip 4. As a result, the electric signal generated from the sensing portion is transmitted to the external circuit connected to the leads 2 through the electrode pads, the bumps 8 and the leads 2.

Bonding method of the bumps 8 and the leads 2 will be described concretely. The bumps 8 are formed on the main surface 4a by wire-bonding method using an Au wiring, while bonding surfaces of the leads 2 are plated with gold, tin or the like.

When the bumps 8 are gold bumps formed by the wire-bonding method, the bumps 8 are connected to the leads 2 through gold plating formed on the leads 2 by the thermocompression bonding or the pressure bonding using both heat and ultrasonic wave, or through tinned contact faces of the leads 2 by the thermocompression bonding.

Incidentally, when the bumps 8 are ball-shaped bumps formed by the wire-bonding method, the bumps 8 are changed in height from several ten $\mu$m to about a half or less by the thermocompression bonding, so that variation in height of the leads 2 is absorbed by deformation of the ball-shaped bumps. In the thermocompression bonding, the leads 2 are heated in a range of 100° C. to 500° C., more preferably, in a range of 200° C. to 400° C.

Further, the plating is performed after the leads 2 are fixed to the stem 1 so that all of the stem 1 and leads 2 are plated since it is difficult to plate only at the contact faces of the leads 2 contacted to the bumps 8. Incidentally, contacting the sensor chip 4 to the leads 2 by the thermocompression bonding or the like is referred to as direct solid state bonding.

As described above, a main feature in this embodiment is that the bumps 8 are electrically connected to the leads 2 by face down bonding so that the main surface 4a of the sensor chip 4 faces the main surface 1a of the stem 1 directly. As a result, the main surface 4a of the sensor chip 4 is disposed close to the main surface 1a of the stem 1.

According to this embodiment, the leads 2 can be disposed within an area corresponding to the sensor chip 4, so that the sensor chip 4 can be mounted on the stem 1 by face down bonding. Therefore, the leads 2 are not necessarily disposed outside of the area corresponding to the sensor chip 4.

Figure 15:
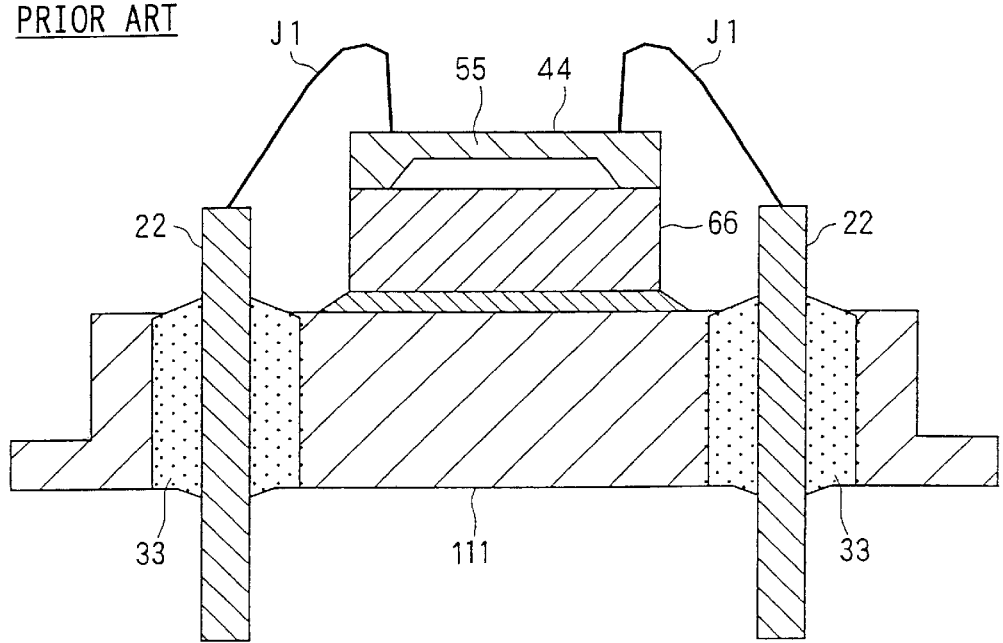
FIG. 15 is a schematic cross sectional view of a pressure sensor of a prior art.

As a result, the stem 1 is miniaturized. In other words, an area for disposing bonding wires, which is needed in the sensor shown in FIG. 15, are unnecessary, whereby the area for disposing bonding wires can be cut down in this embodiment.

Next, modifications of the direct solid state bonding will be described with reference to FIGS. 2 and 3. In a first modification shown in FIG. 2, the bumps 8 are formed by plating, which is different from the ball-shaped bumps described above. In this case, layers composed of Ni, Ti or the like are formed on the electrode pads as substrates 8a.

In this case, the plating bumps can be changed in size arbitrarily in comparison with the ball-shaped bumps. Moreover, the plating bumps can be formed on plural sensor chips 4 at once before the sensor chips 4 are diced from a wafer.

Figure 3:
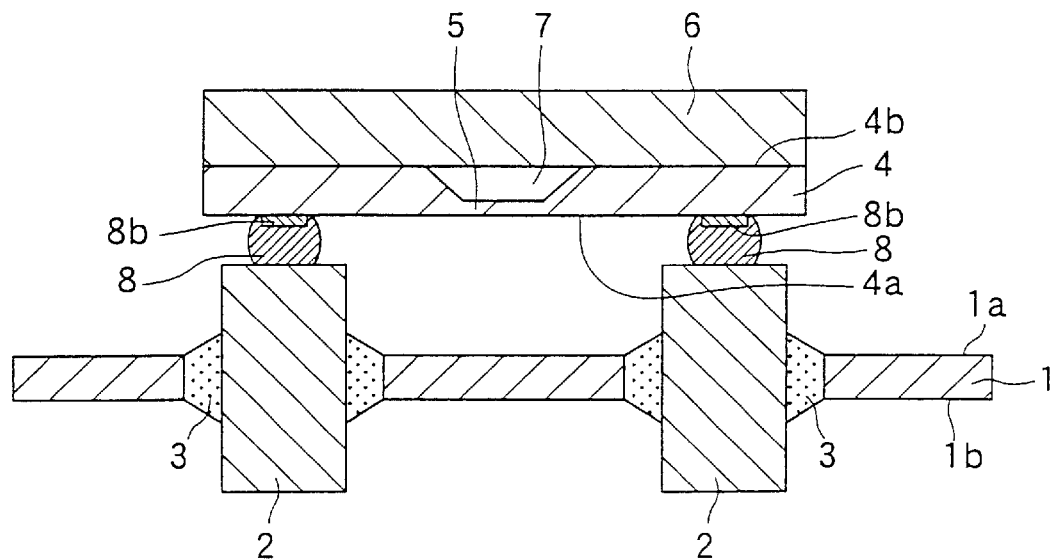
FIG. 3 is a schematic cross sectional view of a pressure sensor (second modified type of the first embodiment)

On the other hand, in a second modification shown in FIG. 3, the bumps 8 are made of solder. In this case, substrates 8b, which are copper or the like formed by plating or the like, are formed on the electrode pads since wettability between solder bumps 8 and the electrode pads is not so good. The solder bumps 8 are formed on the substrates 8b, and then, are connected to the leads 2 by heat reflow soldering or the thermocompression bonding.

In this case, the leads 2 should be plated with gold or tin when the leads 2 are composed of brass, while the leads 2 do not need to be plated when the leads 2 are composed of copper, silver, gold or the like.

Figure 4:
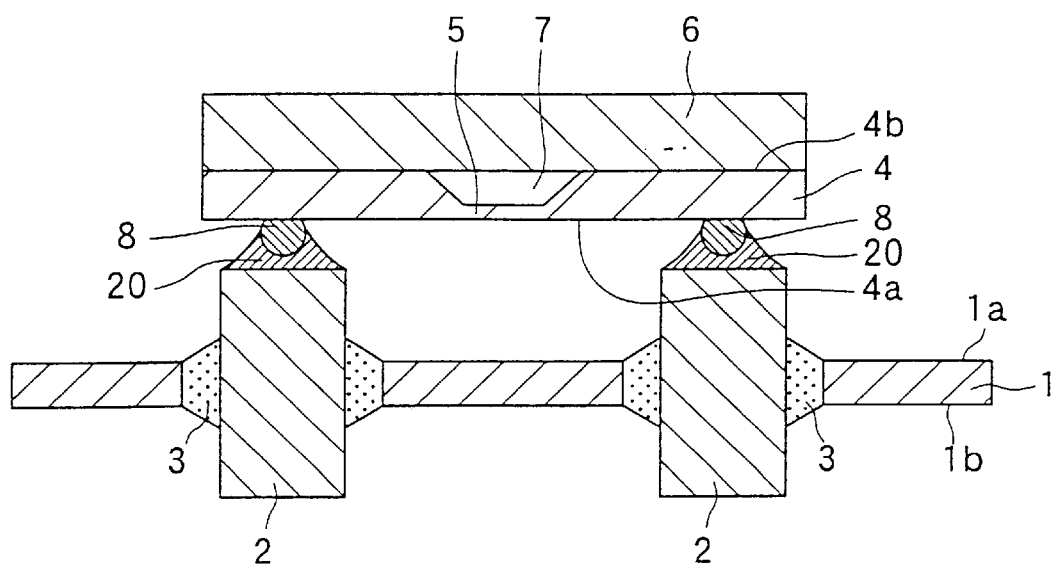
FIG. 4 is a schematic cross sectional view of a pressure sensor (other type of the first embodiment)

Next, indirect bonding will be described. This is different from the direct solid state bonding described above. In the indirect bonding, the bumps 8 formed on the sensor chip 4 are connected to the leads 2 through an intermediate. FIG. 4 shows a case of a first example of the indirect bonding in which the bumps 8 are ball-shaped bumps formed by the wire-bonding method.

A solder or a conductive material is employed as an intermediate 20. When the solder is employed, the solders 20 are disposed on the leads 2 by printing, plating or the like in a thickness of about several ten μm previously. After the sensor chip 4, on which the bumps 8 are formed, is disposed on the leads 2 so that the bumps 8 contact the leads 2, the bumps 8 are connected to the leads 2 by reflow. In this case, the bumps 8 may be gold, copper or the like.

Incidentally, the conductive material used for the intermediate 20 may be a conductive paste such as a silver paste. In this case, the silver paste 20 is disposed on the leads 2 previously, and then is solidified by thermosetting. In this case, the bumps 8 are connected to the leads 2 through the silver paste 2 by the thermocompression bonding.

The conductive material also may be a conductive adhesive as the intermediate 20. In this case, conductive film adhesive (conductive resin film) is adhered to the leads 2, and then, the bumps 8 are connected to the leads 2 by the thermocompression bonding.

Figure 2:
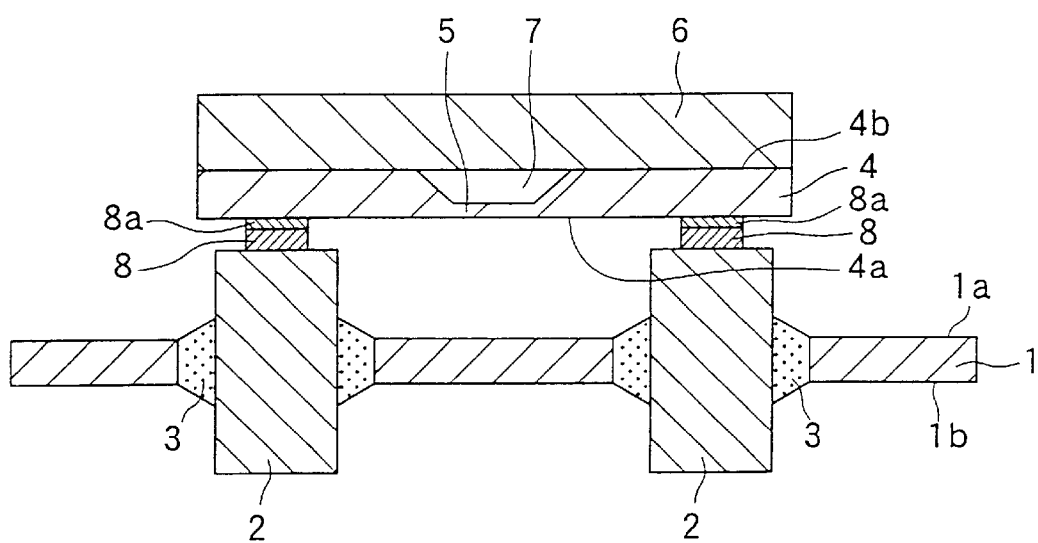
FIG. 2 is a schematic cross sectional view of a pressure sensor (first modified type of the first embodiment)

In the case that the solder, the conductive paste or the conductive adhesive is employed as the intermediate as described above, the bumps 8 formed on the sensor chip 4 may be electrodes formed by plating such as the gold plating shown in FIG. 2. This is a second example of the indirect bonding, and shown in FIG. 5.

According to the indirect bonding described above, the variation in height of the leads 2 can be absorbed by the intermediate 20.

Next, a result found out about a material of the stem 1 will be described with reference to FIG. 6. Table in FIG. 6 shows the difference in the linear expansion coefficient between the sensor chip 4 (silicon) and the stem 1, and the degree of variation in an output signal of the sensor chip 4 that is caused by thermal stress due to the difference in the linear expansion coefficient when material of the stem 1 is varied.

Figures 5, 6:
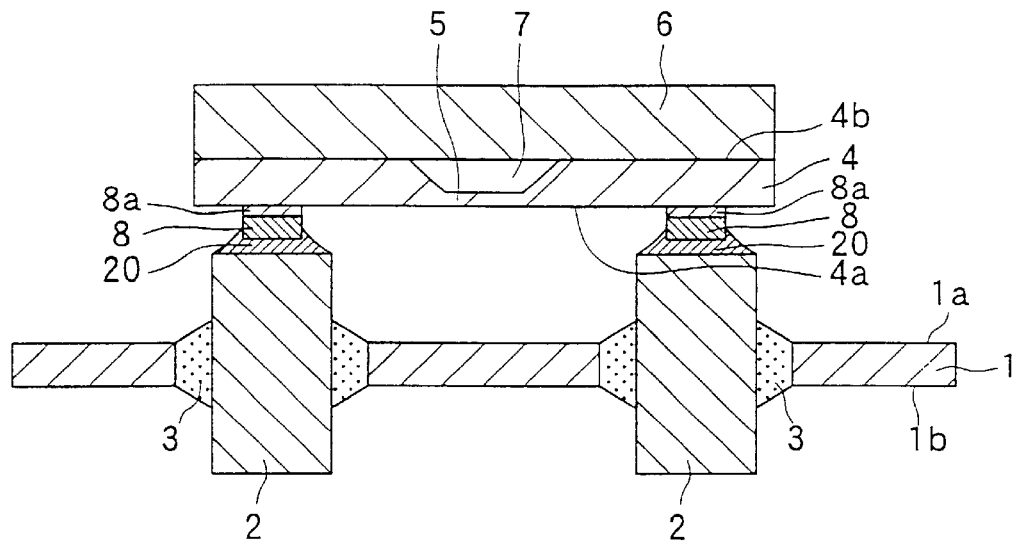
FIG. 5 is a schematic cross sectional view of a pressure sensor (other type of the first embodiment)
FIG. 6 is a table showing a degree of variation in an output signal of the sensor caused by a material of a stem.

As shown in FIG. 6, the material of the stem 1 is more preferabl as the difference in linear expansion coefficient from the sensor chip 4 is smaller. When the stem 1 is composed of iron, the difference is 12 ppm/° C., and the variation in the output signal is large. While the stem 1 is composed of 50 alloy, covar or the like, the difference in the thermal expansion coefficient from silicon is small.

Therefore, as can be understood from FIG. 6, the difference in a liner expansion coefficient between the stem 1 and the sensor chip 4 is preferably 10 ppm/° C. or less. More preferably, the difference is 6 ppm/° C. or less. Furthermore preferably, the difference is 2 ppm/° C. or less. As a result, influence of the thermal stress applied to the sensor chip 4 caused by the thermal expansion of the stem 1 is restrained.

(Second Embodiment)

Figure 7:
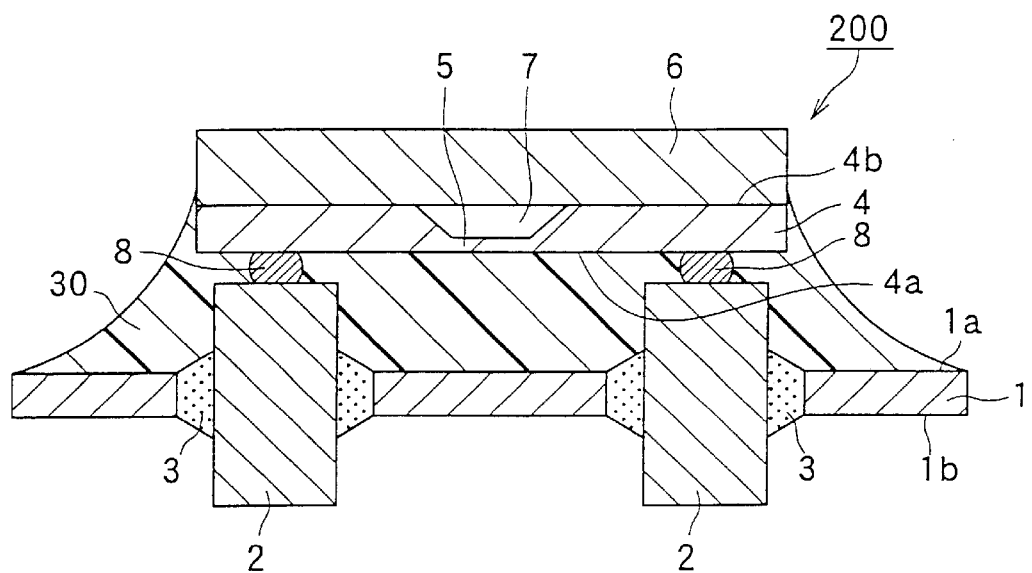
FIG. 7 is a schematic cross sectional view of a pressure sensor (second embodiment)

Referring to FIG. 7, features of a pressure sensor 200 different from the pressure sensor 100 in the first embodiment will be mainly described.

A resin member 30 is disposed on a diaphragm 5 of a sensor chip 4, bumps 8 and leads 2 as a protection member. The resin member 30, which is composed of epoxy resin, polyimide resin, silicone or the like, is injected into a space interposed between the sensor chip 4 and a stem 1 so that the space is filled with the resin member 30. Then, the resin member 30 is solidified by heat.

It should be noted that material as the resin member 30 should be selected in consideration of hardness thereof to transmit pressure to the diaphragm 5 through the resin member 30. Preferably, the resin member 30 is the material with Young's modulus of 1 GPa or less, or a resin with rubber-like elasticity such as a flexible epoxy resin or silicone rubber. More preferably, gel-like resin is employed as the resin member 30 such as a silicone gel.

Figure 8:
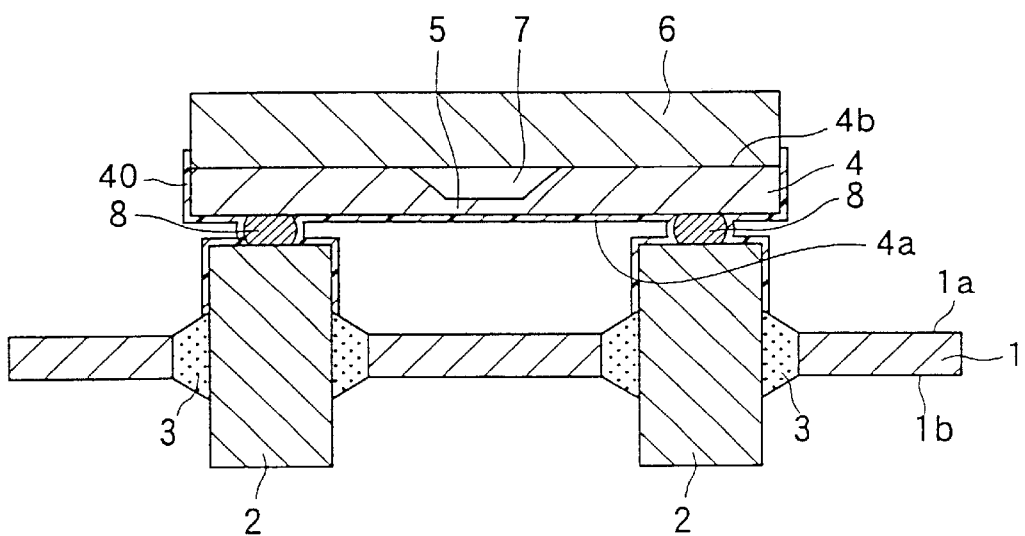
FIG. 8 is a schematic cross sectional view of a pressure sensor (modified type of the first embodiment)

Referring to FIG. 8, a sensor chip 4 and bumps 8 are coated with and protected by resin film (protection film) 40 composed of membranous resin material. The resin film 40 is formed by spin coat method so as to form a thin film of the polyimide resin on surfaces of the sensor chip 4 and so on. In this case, influence of the resin film 40 to an output of the sensor chip 4 can be restrained since the resin film 40 is thin.

The pressure sensor 200 shown in FIG. 7 or FIG. 8 is protected by the resin member 30 or by the resin film 40 as the protection member, so that the pressure sensor 200 endures in adverse environment. Incidentally, the indirect bonding as well as the direct solid state bonding described in the first embodiment may be employed to the pressure sensor 200 in this embodiment.

Incidentally, it is preferable that the resin member 30 or the resin film 40 coats side faces of the sensor chip 4 to protect the sides from environment since the side faces of the sensor chip 4 are exposed after dicing. More preferable, the resin member 30 or the resin film 40 coats the side faces of the sensor chip 4 so that bonding interface between the sensor chip 4 and a pedestal 6 are covered by the resin member 30 or the resin film 40.

(Third Embodiment)

Figure 9:
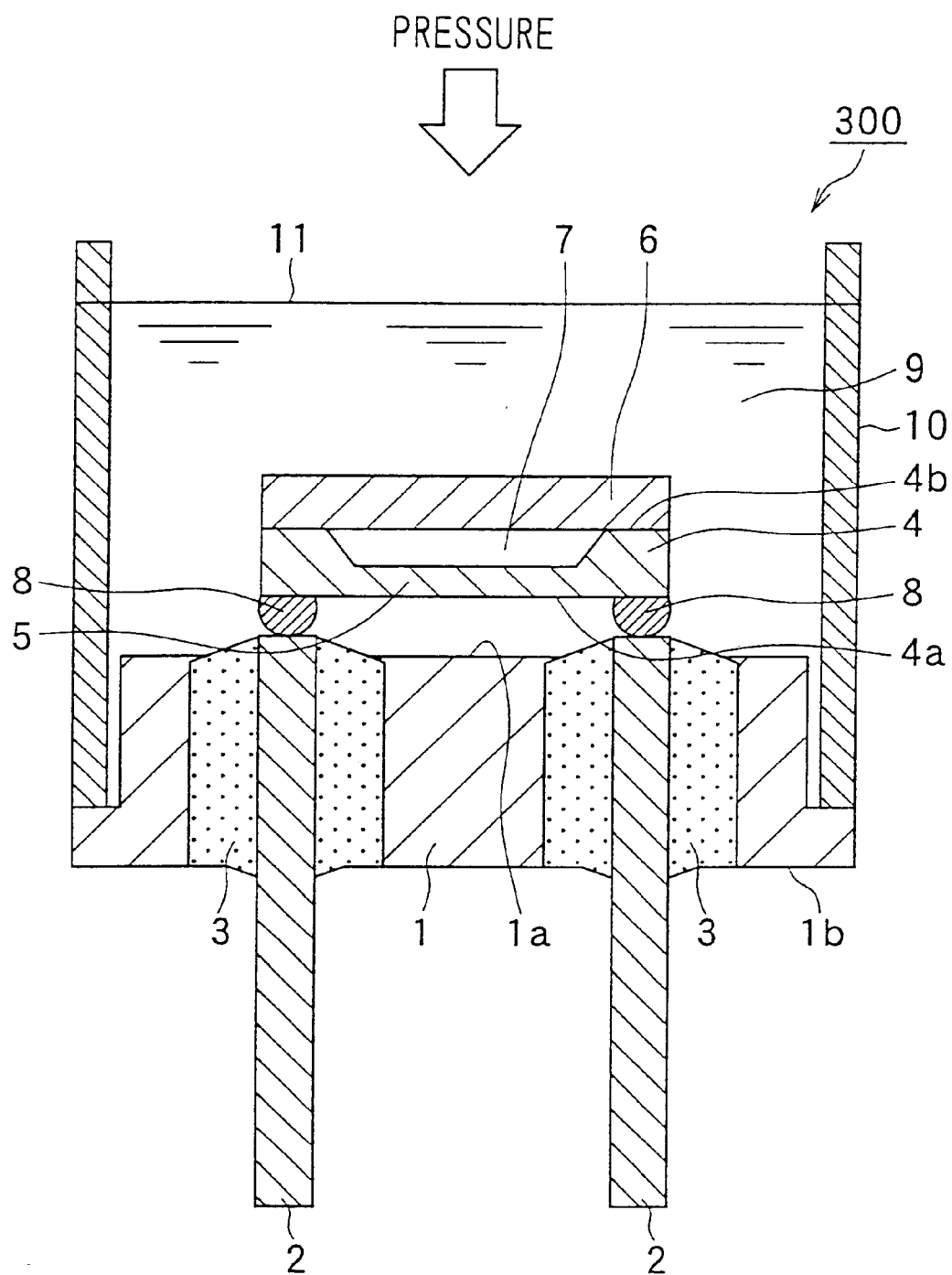
FIG. 9 is a schematic cross sectional view of a pressure sensor (third embodiment)

Referring to FIG. 9, a pressure sensor 300 has a sensor structure as shown in FIG. 1, and oil 9, such as phlorosilicone oil, for sealing a sensor chip 4, bumps 8 and so on. The oil 9 is served as pressure transmitting medium.

A cylinder-like housing 10 has a metallic sealing diaphragm 11 positioned at one end of said cylinder like housing. The metallic sealing diaphragm 11 has an outer circumference that is welded to an inner circumference of said housing at the one end thereof. The other end of the housing 10 is fixed to a peripheral portion of a stem 1 by staking or welding in circumference. A space provided by the housing 10, the stem 1, and the metallic sealing diaphragm 11 is filled with the oil 9.

After the diaphragm 11 is welded to the housing 10 at the one end, the oil 9 is poured in the housing 10 from the other end portion at a predetermined amount by using a dispenser or the like while the one end faces upward. Otherwise, the oil 9 is poured in the housing 10 by weighing using a gravimeter. Pouring of the oil 9 is stopped when an increased weight reaches a predetermined value.

While the other end portion of the housing 10 is set to face upward, a main surface of the stem 1 on which the sensor chip 4 is mounted is faced downward, and then, the housing 10 is fixed to the stem 1 by the staking or welding in vacuum.

In the pressure sensor 300, pressure applied to the metallic sealing diaphragm 11 is transmitted to the sensor chip 4 through the oil 9. Similarly to the pressure sensor 100 described above, the sensor chip 4 senses the pressure, generates and outputs an electric signal in proportion with the pressure. The electric signal is outputted to an external circuit (not shown) through bumps 8 and the leads 2.

According to the third embodiment, the sensor chip 4 and the bumps 8 as a bonding portions disposed between the sensor chip 4 and the leads 2 are protected by the oil 9 while detecting characteristics of the sensor chip 4 is not impaired. Incidentally, the third embodiment can be applied to the first or second embodiment.

(Fourth Embodiment)

Figure 10:
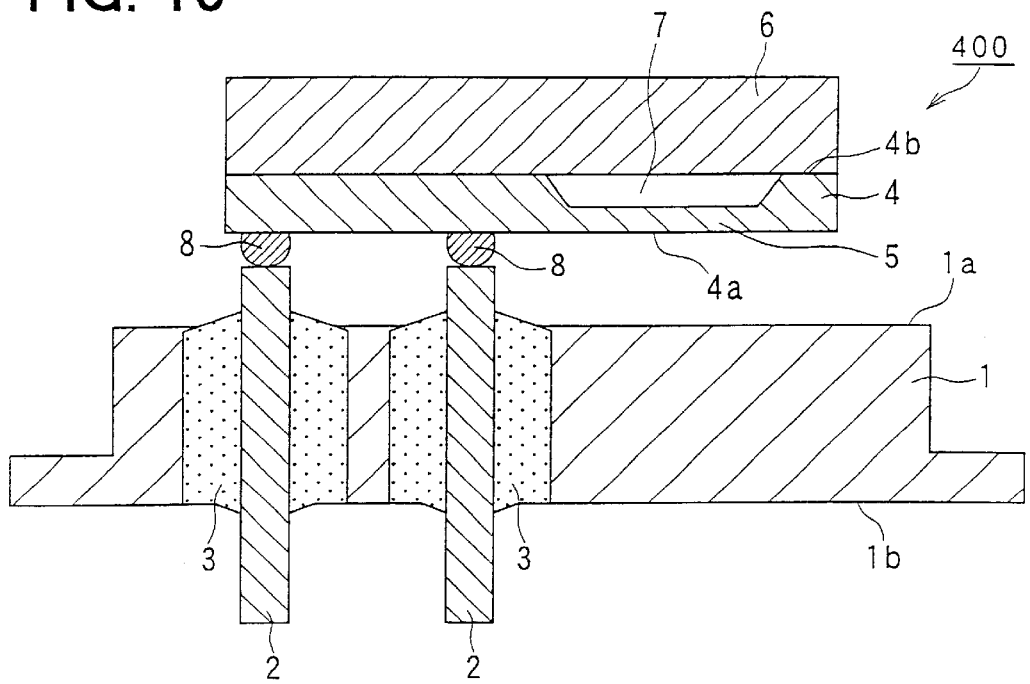
FIG. 10 is a schematic cross sectional view of a pressure sensor (fourth embodiment)
Figure 11A:
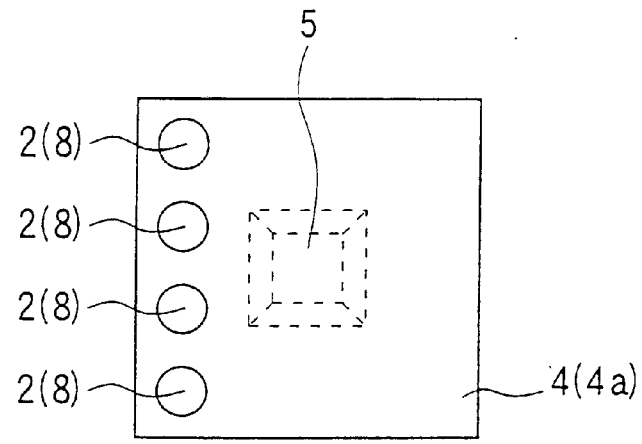
FIGS. 11A to 11C are schematic plan views of a sensor chip showing arrangement of bumps (leads).
Figure 11B:
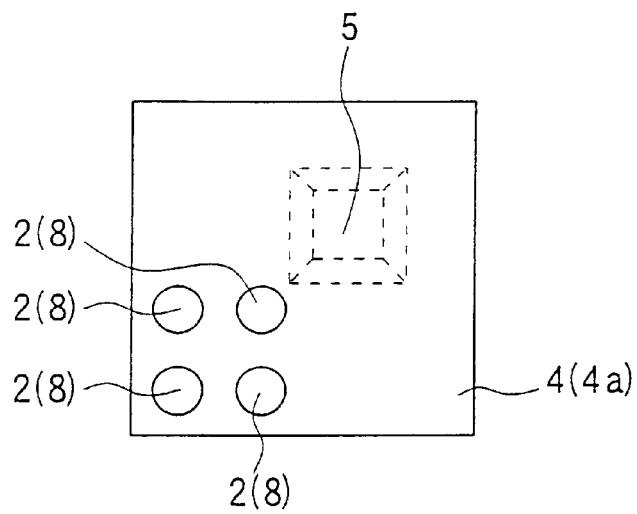
Figure 11C:
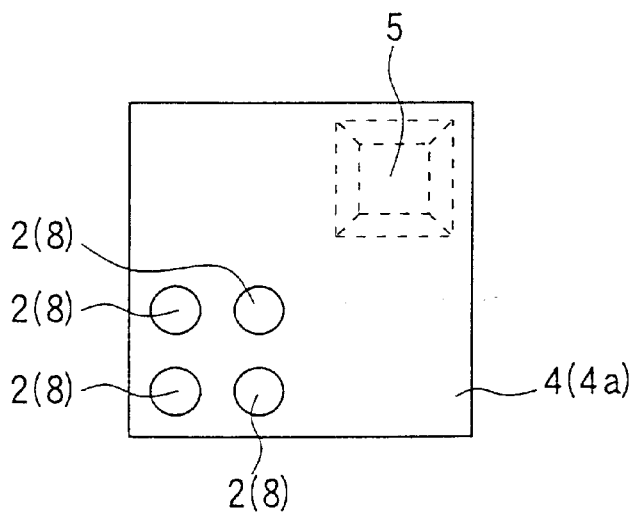

Features different from the first embodiment will be mainly described in this embodiment. Referring to FIG. 10, leads 2 are arranged so that all the leads 2 are fixed to a sensor chip 4 at one side thereof so as not to surround a diaphragm 5. FIGS. 11A to 11C shows a plan view of the sensor chip 4 showing a main surface side thereof.

Four leads 2 are aligned at a peripheral portion located on the one side of the sensor chip 4 having a rectangular shape in FIG. 11A. Four leads 2 are arranged at a corner of the sensor chip 4 so that the four leads 2 form a rectangular in FIG. 11B.

Moreover, as shown in FIG. 11C, the diaphragm 5 is located at a corner disposed on the sensor chip 4 diagonally to the corner in which the leads 2 are located. As a result, the diaphragm 5 is disposed away from the leads 2 in comparison with an arrangement of the diaphragm 5 shown in FIG. 11B.

According to this embodiment, although a stress transmitted from the stem 1 is applied to a portion where the leads 2 are fixed, the stress is restrained from reaching the diaphragm 5.

Incidentally, in the case that the leads 2 are arranged so as to surround the diaphragm 5 as described in the first embodiment, a stress caused by a difference in a linear expansion coefficient between the stem 1 and the sensor chip 4 is transmitted to the diaphragm 5 through the bumps 8.

Therefore, according to this embodiment, the pressure sensor 300 can be miniaturized, and the stress due to the difference in the linear expansion coefficient between the stem 1 and the sensor chip 4 is restrained from transmitting to the diaphragm efficiently, so that sensor characteristics is restrained from being impaired. Therefore, an effect of stress relief also depends on a distance between each of the leads 2. The effect increases in order of FIG. 11A, FIG. 11B, and FIG. 11C.

(Fifth Embodiment)

Figure 12:
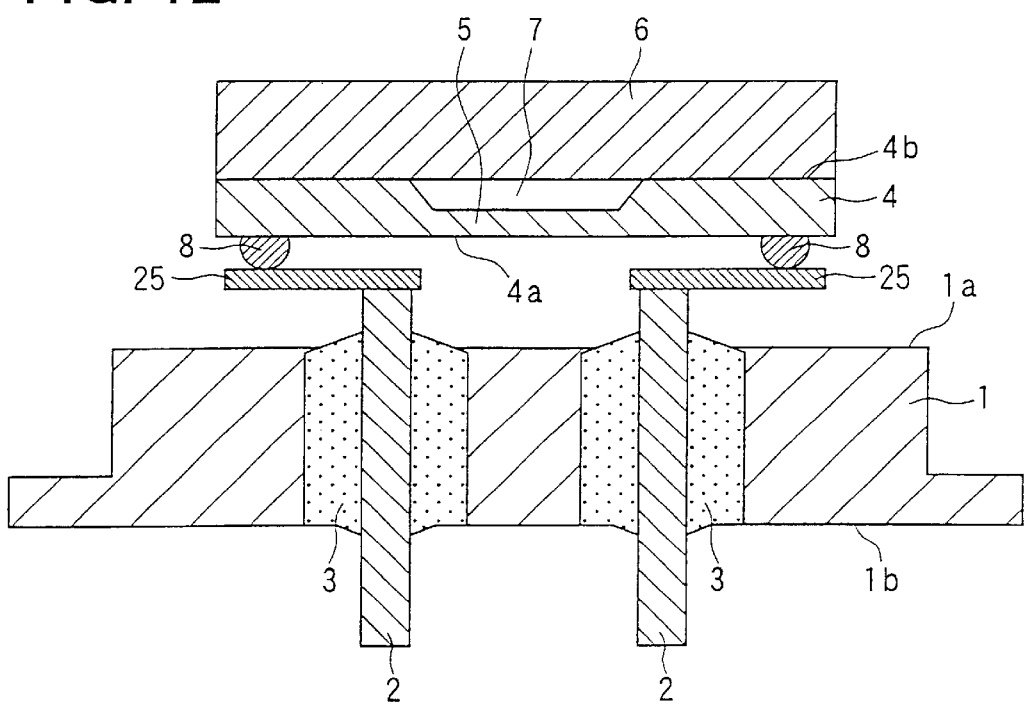
FIG. 12 is a schematic cross sectional view of a pressure sensor (fifth embodiment)

Features different from the first embodiment will be mainly described in this embodiment. Referring to FIG. 12, lead frames 25 are disposed between bumps 8 and leads 2 as a stress relief member. The lead frames 25 are composed of a conductive metal such as copper, and have a long platy shape. The lead frame 25 is connected to the bump 8 at one end thereof, and connected to the lead 2 at the other end thereof. The lead frames 25 can be deformed elastically at a mid portion thereof so that stress, which is transmitted from the stem 1 to the sensor chip 4, can be released.

Incidentally, laser welding or the like is employed to fix the lead frames 25 to the leads 2, and thermocompression bonding or the like is employed to fix the lead frames 25 to the bumps 8.

According to a first example shown in FIG. 12, a stress relief member is the lead frame 25 whose one end is connected to the bump 8, the other end is connected to the lead 2, and the mid portion can be deformed elastically.

Therefore, a stress caused by a difference in a linear expansion coefficient between the stem 1 and the sensor chip 4 is prevented from transmitting to the sensor chip 4 efficiently since the stress is released by elastic deformation of the lead frames 25. As a result, the stress is restrained from transmitting to the diaphragm 5 efficiently.

Figure 13B:
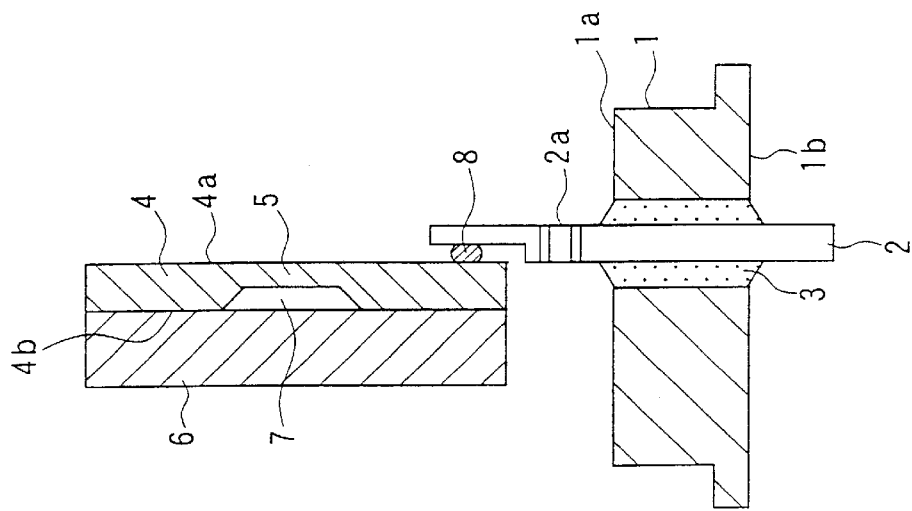
FIG. 13B is a schematic cross sectional view taken along line XIIIB—XIIIB shown in FIG. 13A.
Figure 13A:
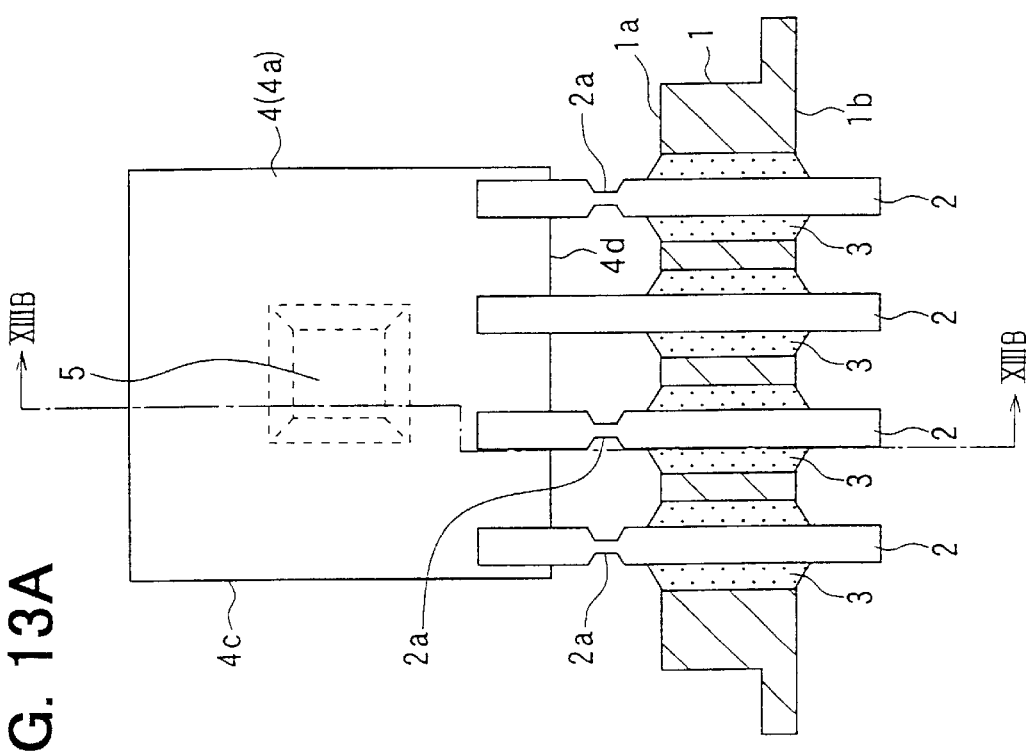
FIG. 13A is a schematic cross sectional view of a pressure sensor (modified type of the fifth embodiment)

Incidentally, a second example of the stress relief member is shown in FIGS. 13A and 13B. In the second example, a sensor chip 4 is arranged so that a main surface 4a of the sensor chip 4a is disposed in perpendicular to a main surface 1a of a stem 1. FIG. 13A is a plan view of the sensor chip 4 and a cross sectional view of the stem 1 so that a main surface 4a of the sensor chip 4 can be seen. FIG. 13B is a cross sectional view of a pressure sensor taken along line XIIIB—XIIIB in FIG. 13A.

In this example, an hourglass portion 2a is formed in an extending portion of a lead 2 extending from the main surface 1a of the stem 1 as the stress relief member formed by press or the like. The hourglass portion 2a is formed narrower than other portion of the lead 2. A stress caused by a difference in a linear expansion coefficient between the stem 1 and the sensor chip 4 is restrained from transmitting to the sensor chip 4 efficiently by elastic deformation of the hourglass portions 2a. Similarly to the first example using the lead frame 25 described above, the stress is restrained from transmitting to the diaphragm 5 efficiently.

According to the first or second example described above, the pressure sensor can be miniaturized, and the stress caused by the difference in the linear expansion coefficient between the stem 1 and the sensor chip 4 is restrained from transmitting to the diaphragm 5 efficiently.

Incidentally, in the second example shown in FIG. 13A, the hourglass portion 2a is formed in three of the four leads 2, and is not formed in the remaining one of the four leads 2. In the case that the hourglass portion 2a is formed in a plurality of leads 2 as the stress relief member, it is preferable that the hourglass portion 2a is not formed in at least one of the plurality of leads 2, since strength for supporting the sensor chip 4 is weakened when the hourglass portion 2a is formed in all of the plurality of leads 2.

Incidentally, the sensor chip 4, shown in FIG. 1, 2, 3, 4, 5, 7, 8, 9, 10, 12, or 14 except FIGS. 13A and 13B, is disposed on the stem 1 so that the main surface 4a of the sensor chip 4 faces the main surface 1a of the stem 1, and the bumps 8 are electrically connected to the leads 2. On the other hand, the sensor chip 4 shown in FIGS. 13A and 13B is disposed on the stem 1 so that the main surface 4a and a side face 4c of the sensor chip 4 are in perpendicular to the main surface 1a of the stem 1, and a side face 4d of the sensor chip 4 faces the main surface 1a of the stem 1. Bumps 8 are aligned along a side of the main surface 4a, which is near the main surface 1a of the stem 1. The four leads 2 are arranged along the side of the main surface 4a so that the four leads 2 are in parallel with the main surface 4a.

According to the second example shown in FIGS. 13A and 13B, the main surface 4a of the sensor chip 4 is disposed in perpendicular to the main surface 1a of the stem 1, the pressure sensor can be nevertheless miniaturized efficiently by cutting down a space for disposing bonding wires in the stem 1 since the sensor chip 4 can be electrically connected to the stem 1 without the bonding wires.

Incidentally, the main surface 4a of the sensor chip 4 may not be disposed perpendicular to the main surface 1a of the stem 1, but may be disposed in oblique to the main surface 1a. Moreover, the hourglass portion 2a shown in FIGS. 13A and 13b can be employed to the leads 2 even if the main surface 4a of the sensor chip 4 faces the main surface 1a of the stem 1 as shown in FIG. 1 or 10.

Incidentally, the features, which will be described hereinafter, described in the first through the third embodiments can be employed to the pressure sensor described in the fourth or fifth embodiment.

(1) The difference in a liner expansion coefficient between the stem 1 and the sensor chip 4 is preferably 2 ppm/° C. or less. The difference may be 10 ppm/° C. or less, or 6 ppm/° C. or less. The value of the difference may be selected according to requirement of the sensor.

(2) The leads 2 are disposed within an area corresponding to the sensor chip 4 when the sensor chip 4 is fixed to the stem 1 through the leads 2, so that the stem can be miniaturized.

(3) The bumps 8 may be ball-shaped bumps formed by wire-bonding method.

(4) The bumps 8 may be electrodes formed by plating.

(5) The connection between the bumps 8 and the leads 2 may be performed by the direct solid state bonding applying the thermocompression bonding or the ultrasonic-compression bonding, or performed by the indirect bonding using the intermediate 20.

(6) The sensor chip 4 and the bumps 8 are coated with the protection member (protection resin 30 or protection film 40) as shown in FIGS. 7 and 8. The stress relief member such as the lead frames 25 or the hourglass portions 2a may be also coated with the protection member.

(7) The bonding interface between the sensor chip 4 and the pedestal 6 is coated with the protection member.

(8) The space surrounding the sensor chip 4 may be filled with the sealing oil 9.

Other embodiment will be described with reference to FIG. 14. Bump 8 may be a laminating structure composed of an electrode formed by plating and a ball-shaped bump formed by wire-bonding method.

Figure 14:
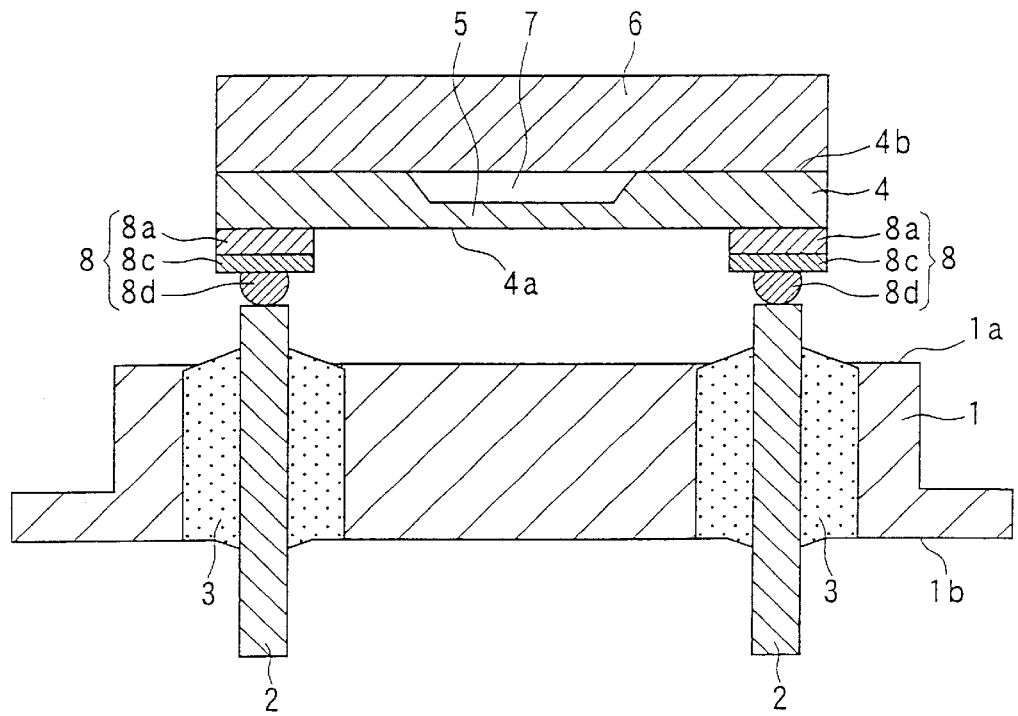
FIG. 14 is a schematic cross sectional view of a pressure sensor (sixth embodiment)

As shown in FIG. 14, the bump 8 is formed on a main surface 4a, and formed by laminating a substrate 8a composed of Ni, Ti, or the like, an electrode 8c formed by plating gold or the like, and a ball-shaped bump 8d formed by gold wire-bonding method or the like in this order.

In the case that the bump 8 is only composed of the ball-shaped bump, a stress caused when the bump 8 is formed is directly applied to the sensor chip 4, so that the sensor chip 4 may be damaged, or bonding strength may be weakened.

On the other hand, according to the bump 8 shown in FIG. 14, the electrode 8c is formed on an electrode pad, which is disposed on the sensor chip 4, by the plating previously. Then, the ball-shaped bump 8d is formed on the electrode 8c by the wire-bonding method, so that the electrode 8c works as a barrier to protect the sensor chip 4 when the ball-shaped bump 8d is formed. Namely, the sensor chip 4 is prevented from being damaged when the ball-shaped bump 8d is formed.

Incidentally, although the stem is employed as the base, a connecter housing, described in Japanese laid-open patent specifications Nos. 7-209115, or in U.S. Pat. No. 5,595,939, may be employed as the base. Moreover, a sensor chip having a comb-shaped beam structure as a sensing portion, such as an acceleration sensor having a capacitance change detection structre, may be employed instead of the sensor chip having the diaphragm.

In short, the main features in this invention is that the sensor chip having the sensing portion is electrically connected to the leads formed in the stem as the base through the bumps by the face down bonding. Other feathers can be changed according to a design choice.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A sensor comprising:
   a base having leads extending from a surface thereof;
   a sensor chip having a sensing portion to generate an electric signal according to an amount of physical quantity applied thereto, and having conductive bumps formed on a surface thereof; and
   a stress relief member interposed between one of the bumps and one of the leads, for preventing transmission of stress caused by a difference in a linear expansion coefficient between the base and the sensor chip from the base to the sensor chip;
   wherein the surface of the sensor chip faces the surface of the base with the bumps interposed therebetween, and the sensor chip is electrically connected to the leads through the bumps,
   the stress relief member is composed of a lead frame, the lead frame comprising:
     one end connected to the one of the bumps;
     another end connected to the one of the leads; and
     a mid portion capable of elastically deforming, disposed between the one end and the another end.

2. The sensor according to claim 1, wherein the leads are disposed within an area corresponding to the sensor chip.

3. The sensor according to claim 1, wherein each of the bumps is composed of an electrode plate and a ball-shaped bump formed on the electrode plate.

4. The sensor according to claim 1, wherein the bumps are arranged on one side of the surface of the sensor chip so that the bumps do not surround the sensing portion formed in the sensor chip.

5. A sensor comprising:
   a base having leads extending from a surface thereof;
   a sensor chip having a sensing portion to generate an electric signal according to an amount of physical quantity applied thereto, and having conductive bumps formed on a surface thereof; and
   an hourglass portion formed in at least one of the leads, the hourglass portion being weakened in strength in comparison with a portion other than the hourglass portion in the at least one of the leads;
   wherein the surface of the sensor chip faces the surface of the base with the bumps interposed therebetween, and the sensor chip is electrically connected to the leads through the bumps, and
   the hourglass portion prevents a stress caused by a difference in a linear expansion coefficient between the base and the sensor chip from transmitting from the base to the sensor chip.

6. The sensor according to claim 5, wherein the leads are disposed within an area corresponding to the sensor chip.

7. The sensor according to claim 5, wherein each of the bumps is composed of an electrode plate and a ball-shaped bump formed on the electrode plate.

8. The sensor according to claim 5, wherein the bumps are arranged on one side of the surface of the sensor chip so that the bumps do not surround the sensing portion formed in the sensor chip.

9. A pressure sensor comprising:
a metallic stem;
leads fixed to the metallic stem so that each of the leads penetrates the stem from a main surface to a back surface thereof;
a sensor chip having a diaphragm formed on a surface thereof;
conductive bumps formed on the surface of the sensor chip; and
a pedestal fixed to the sensor chip at a back surface of the sensor chip;
wherein the bumps are electrically connected to the leads so that the surface of the sensor chip faces the main surface of the stem,
the sensor chip and the bumps are coated with a protection member,
a side of the sensor chip is covered with the protection member, and
a bonding interface between the sensor chip and the pedestal is covered with the protection member.

10. The pressure sensor according to claim 9, wherein:
a difference in a linear expansion coefficient between the stem and the sensor chip is 10 ppm/°C. or less.

11. The pressure sensor according to claim 10, wherein the difference is 6 ppm/°C. or less.

12. The pressure sensor according to claim 11, wherein the difference is 2 ppm/°C. or less.

13. The pressure sensor according to claim 9, wherein the leads are disposed within an area corresponding to the sensor chip.

14. The pressure sensor according to claim 9, wherein each of the bumps is a ball-shaped bump.

15. The pressure sensor according to claim 9, wherein each of the bumps is an electrode plate.

16. The pressure sensor according to claim 9, wherein each of the bumps is composed of an electrode plate and a ball-shaped bump formed on the electrode plate.

17. The pressure sensor according to claim 9, wherein the bumps are directly bonded to the leads in solid state.

18. The pressure sensor according to claim 9, wherein the bumps are bonded to the leads with an intermediate interposed therebetween.

19. The pressure sensor according to claim 9, wherein the protection member is composed of a material with a Young's modulus of 1 GPa or less.

20. The pressure sensor according to claim 9, wherein the protection member is composed of a resin with rubber-like elasticity.

21. The pressure sensor according to claim 9, wherein the protection member is composed of a gel resin.

22. The pressure sensor according to claim 9, wherein the protection member is composed of a resin film.

23. The pressure sensor according to claim 9, wherein the bumps are arranged on one side of the surface of the sensor chip so that the bumps do not surround the sensing portion formed in the sensor chip.

24. The pressure sensor according to claim 9, further comprising:
a stress relief member interposed between one of the bumps and one of the leads for preventing transmission of stress caused by a difference in a linear expansion coefficient between the base and the sensor chip from the base to the sensor chip.

25. The pressure sensor according to claim 24, wherein the stress relief member is composed of a lead frame, the lead frame comprising:
one end connected to the one of the bumps;
another one end connected to the one of the leads; and
a mid portion capable of elastically deforming, disposed between the one end and the another one end.

26. A pressure sensor comprising:
a metallic stem;
leads fixed to the stem so that each of the leads penetrates the stem from a main surface to a back surface thereof;
a sensor chip having a diaphragm formed on a surface thereof;
conductive bumps formed on the surface of the sensor chip; and
an hourglass portion formed in at least one of the leads, the hourglass portion being weakened in strength in comparison with a portion other than the hourglass portion in the at least one of the leads;
wherein the bumps are electrically connected to the leads so that the surface of the sensor chip faces the main surface of the stem, and
the hourglass portion prevents a stress caused by a difference in a linear expansion coefficient between the base and the sensor chip from transmitting from the base to the sensor chip.

27. A sensor comprising:
a base having leads extending from a surface thereof;
a sensor chip having a sensing portion to generate an electric signal according to an amount of physical quantity applied thereto, the sensor chip having conductive bumps formed on a surface thereof; and
an hourglass portion formed in at least one of the leads, the hourglass portion being weakened in strength in comparison with a portion other than the hourglass portion in the at least one of the leads;
wherein the sensor chip is directly connected to the leads through the bumps so that the surface of the sensor chip is disposed in non-parallel fashion with respect to the surface of the base,
the surface of the sensor chip is disposed in perpendicular relationship to the surface of the base so that the leads extend in a direction that is parallel with the surface of the sensor chip, and
the hourglass portion prevents a stress caused by a difference in a linear expansion coefficient between the base and the sensor chip from transmitting from the base to the sensor chip.

28. A sensor according to claim 27, wherein the hourglass portion is not formed in at least another one of the leads.

29. A pressure sensor comprising:
a metallic stem having several holes penetrating from a main surface to a back surface thereof;
leads fixed to the stem so that each of the leads penetrates the stem through each of the holes respectively;
a sensor chip having a diaphragm formed on a surface thereof; and
conductive bumps formed on the surface of the sensor chip;
wherein the bumps are electrically connected to the leads so that the surface of the sensor chip faces the main surface of the stem, and the leads are disposed within an area corresponding to the sensor chip.

30. The pressure sensor according to claim 29, wherein the bumps and the leads are connected by direct solid state bonding.

31. The pressure sensor according to claim 30, wherein the bumps are ball-shaped bumps made of Au through wiring bonding or Ni bumps through plating, and the leads are plated with Au or Sn.

32. The pressure sensor according to claim 30, wherein the bumps include laminated bumps each of which have a substrate composed of Ni or Ti to protect the sensor chip when the bumps are connected to the leads by direct solid state bonding.

33. The pressure sensor according to claim 30, wherein a difference in a linear expansion coefficient between the stem and the sensor chip is 10 ppm/°C. or less.

34. The pressure sensor according to claim 33, wherein the difference is 6 ppm/°C. or less.

35. The pressure sensor according to claim 34, wherein the difference is 2 ppm/°C. or less.

36. The pressure sensor according to claim 31, wherein the bumps include laminated bumps each of which has a substrate composed of Ni or Ti to protect the sensor chip when the bumps are connected to the leads by direct solid state bonding.

37. The pressure sensor according to claim 26, wherein the bumps and the leads are connected by direct solid state bonding using one of thermocompression bonding, ultrasonic-compression bonding and pressure bonding.

38. The pressure sensor according to claim 29, further comprising:

an hourglass portion formed in at least one of the leads, the hourglass portion being weakened in strength in comparison with a portion other than the hourglass portion in the at least one of the leads;

wherein the hourglass portion prevents transmission of stress caused by a difference in a linear expansion coefficient between the base and the sensor chip from the base to the sensor chip.

39. The sensor according to claim 29, further comprising:

a stress relief member interposed between one of the bumps and one of the leads for preventing transmission of stress caused by a difference in a linear expansion coefficient between the base and the sensor chip from the base to the sensor chip.

40. The pressure sensor according to claim 29, wherein the bumps are arranged on one side of the surface of the sensor chip so that the bumps do not surround the sensing portion formed in the sensor chip.

41. The pressure sensor according to claim 29, wherein the sensor chip and the bumps are coated with a protection member.

42. The pressure sensor according to claim 41, wherein the protection member is composed of a material with a Young's modulus of 1 GPa or less.

43. The pressure sensor according to claim 41, wherein the protection member is composed of a resin with rubber-like elasticity.

44. The pressure sensor according to claim 41, wherein the protection member is composed of a gel resin.

45. The pressure sensor according to claim 41, wherein the protection member is composed of a resin film.

46. The pressure sensor according to claim 41, wherein a side of the sensor chip is covered with the protection member.

47. The pressure sensor according to claim 46, further comprising a pedestal fixed to the sensor chip at a back surface of the sensor chip, wherein:

a bonding interface between the sensor chip and the pedestal protection member is covered with the protection member.

48. The pressure sensor according to claim 29, further comprising a housing containing the sensor chip therein, wherein the housing is filled with an oil.

49. A sensor comprising:

a base having leads extending from a surface thereof; and a sensor chip having a sensing portion for generating an electric signal according to an amount of physical quantity applied thereto, the sensor chip having conductive bumps formed on a surface thereof, wherein the sensor chip is directly connected to a portion of the leads extending from the surface of the base through the bumps so that the surface of the sensor chip is disposed in non-parallel fashion with respect to the surface of the base, and the leads are located within a side of the sensor chip.

50. The pressure sensor according to claim 49, further comprising:

an hourglass portion formed in at least one of the leads, the hourglass portion being weakened in strength in comparison with a portion other than the hourglass portion in the at least one of the leads;

wherein the hourglass portion prevents transmission of stress caused by a difference in a linear expansion coefficient between the base and the sensor chip from the base to the sensor chip.

51. The pressure sensor according to claim 50, wherein the hourglass portion is not formed in a least another one of the leads.

52. The pressure sensor according to claim 49, wherein the sensor chip and the bumps are coated with a protection member.

53. The pressure sensor according to claim 52, wherein the protection member is composed of a material with a Young's modulus of 1 GPa or less.

54. The pressure sensor according to claim 52, wherein the protection member is composed of a resin with rubber-like elasticity.

55. The pressure sensor according to claim 52, wherein the protection member is composed of a gel resin.

56. The pressure sensor according to claim 52, wherein the protection member is composed of a resin film.

57. The pressure sensor according to claim 52, wherein a side of the sensor chip is covered with the protection member.

58. The pressure sensor according to claim 57, further comprising a pedestal fixed to the sensor chip at a back surface of the sensor chip, wherein:

a bonding interface between the sensor chip and the pedestal is covered with the protection member.

* * * * *